(12) United States Patent
Chen

(10) Patent No.: US 6,893,542 B1  
(45) Date of Patent: May 17, 2005

(54) SPUTTERED MULTILAYER MAGNETIC RECORDING MEDIA WITH ULTRA-HIGH COERCIVITY

(75) Inventor: Ga-Lane Chen, Fremont, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 163 days.

(21) Appl. No.: 10/285,422

(22) Filed: Nov. 1, 2002

Related U.S. Application Data

(62) Division of application No. 09/625,053, filed on Jul. 24, 2000, now abandoned.
(60) Provisional application No. 60/153,374, filed on Sep. 10, 1999.

(51) Int. Cl.[7] .................................................. C23C 14/34
(52) U.S. Cl. ............................ 204/192.2; 204/192.15; 204/192.16
(58) Field of Search ........................ 204/192.2, 192.15, 204/192.16

(56) References Cited

U.S. PATENT DOCUMENTS

| | | | |
|---|---|---|---|
| 4,359,753 A | 11/1982 | Marshall | 347/112 |
| 4,430,183 A | 2/1984 | Schuller et al. | 204/192.11 |
| 4,587,176 A | 5/1986 | Carcia | 428/611 |
| 4,678,721 A | 7/1987 | den Broeder et al. | 428/607 |
| 4,920,013 A | 4/1990 | Kobayashi et al. | 428/694 TM |
| 5,068,022 A | 11/1991 | Carcia | 204/192.15 |
| 5,106,703 A | 4/1992 | Carcia | 428/635 |
| 5,231,048 A | 7/1993 | Guha et al. | 438/485 |
| 5,366,815 A | 11/1994 | Araki et al. | 428/611 |
| 5,370,945 A | 12/1994 | Osato | 428/635 |
| 5,650,889 A | 7/1997 | Yamamoto et al. | 360/135 |
| 5,660,930 A | 8/1997 | Bertero et al. | 428/332 |
| 5,702,830 A | 12/1997 | Miller et al. | 428/611 |
| 5,750,270 A | 5/1998 | Tang et al. | 428/611 |
| 5,837,386 A | 11/1998 | Miller et al. | 428/623 |
| 5,851,363 A | 12/1998 | Miller et al. | 204/192.2 |
| 5,968,627 A | 10/1999 | Nigam et al. | 204/192.2 |
| 5,989,728 A | 11/1999 | Coffey et al. | 428/611 |
| 6,022,630 A | 2/2000 | Miller et al. | 428/611 |
| 6,033,538 A | 3/2000 | Suwabe et al. | 204/192.26 |
| 6,251,532 B1 | 6/2001 | Futamoto et al. | 360/110 |

FOREIGN PATENT DOCUMENTS

| | | |
|---|---|---|
| JP | 02-148417 A | 6/1990 |
| JP | 08-017032 A | 1/1996 |

OTHER PUBLICATIONS

JPO Abstract Translation of JP 01–148417A (Clipped Image No. JP402148417A)

JPO Abstract Translation of JP 08–017032A (Clipped Image No. JP408017032A).

*Primary Examiner*—Rodney G. McDonald
(74) *Attorney, Agent, or Firm*—McDermott Will & Emery LLP

(57) ABSTRACT

Improved multilayer magnetic superlattice structures, such as $(Co/Pt)_n$ and $(CO/Pd)_n$, having perpendicular magnetic coercivities as high as about 10,000 Oe, are formed by sputtering in Kr and/or Xe atmospheres at relatively high power densities and relatively small target-to-substrate spacings. The magnetic superlattice structures are advantageously utilized in the formation of the thermally stable, perpendicular magnetic recording media having ultra-high areal recording densities of from about 100 Gbit/in$^2$ to about 600 Gbit/in$^2$.

11 Claims, 2 Drawing Sheets

SPUTTERED MULTILAYER MAGNETIC RECORDING MEDIA WITH ULTRA-HIGH COERCIVITY

CROSS-REFERENCE TO PROVISIONAL APPLICATION

This application is a divisional of application Ser. No. 09/625,053 filed Jul. 24, 2000 now abandoned, which claims priority of U.S. Provisional Application No. 60/153,374, filed Sep. 10, 1999.

FIELD OF THE INVENTION

The present invention relates to an improved perpendicular magnetic recording medium comprising a sputtered multilayer magnetic superlattice exhibiting ultra-high values of perpendicular magnetic coercivity and areal storage density, and a sputtering method for manufacturing same. The invention finds particular utility in the fabrication of very high areal recording density magnetic media and devices such as hard disks.

BACKGROUND OF THE INVENTION

Magnetic recording ("MR") media and devices incorporating same are widely employed in various applications, particularly in the computer industry for data/information storage and retrieval purposes, typically in disk form. Conventional magnetic thin-film media, wherein a fine-grained polycrystalline magnetic alloy layer serves as the active recording medium layer, are generally classified as "longitudinal" or "perpendicular", depending upon the orientation of the magnetic domains of the grains of magnetic material.

Efforts are continually being made with the aim of increasing the areal recording density, i.e., the bit density, or bits/unit area, of the magnetic media However, severe difficulties are encountered when the bit density of longitudinal media is increased above about 20–50 Gb/in$^2$ in order to form ultra-high recording density media, such as thermal instability, when the necessary reduction in grain size exceeds the superparamagnetic limit. Such thermal instability can, inter alia, cause undesirable decay of the output signal of hard disk drives, and in extreme instances, result in total data loss and collapse of the magnetic bits. In this regard, the perpendicular recording media have been found superior to the more common longitudinal media in achieving very high bit densities.

As indicated above, much effort has been directed toward enhancing the density of data storage by both types of magnetic media, as well as toward increasing the stability of the stored data and the ease with which the stored data can be read. For example, it is desirable to develop magnetic media having large magnetic coercivities, $H_c$, since the magnetic moments of such materials require large magnetic fields for reorientation, i.e., switching between digital $1^s$ and $0^s$. Thus, when the magnetic medium has a large coercivity $H_c$, exposure of the magnetic medium to stray magnetic fields, such as are generated during writing operations, is less likely to corrupt data stored at adjacent locations.

The density with which data can be stored within a magnetic thin-film medium for perpendicular recording is related to the perpendicular anisotropy ("Ku" or "$K_\perp$") of the material, which reflects the tendency for the magnetic moments to align in the out-of-plane direction. Thin-film magnetic media having high perpendicular anisotropies have their magnetic moments aligned preferentially perpendicular to the plane of the thin film. This reduces the transition length between the areas with magnetic moments of opposite direction, thereby allowing a larger number of magnetic bits (domains) to be packed into a unit area of the film and increasing the areal density with which data can be stored.

A large perpendicular anisotropy is also reflected in a larger value of the magnetic coercivity $H_c$, since the preferential out-of-plane alignment of the magnetic moments raises the energy barrier for the nucleation of a reverse magnetization domain, and similarly, makes it harder to reverse the orientation of the magnetic domains by 180° rotation. Further, the magnetic remanence of a medium, which measures the tendency of the magnetic moments of the medium to remain aligned once the magnetic field is shut off following saturation, also increases with increasing $K_\perp$.

A promising new class of materials for use as the active recording layer of perpendicular MR media includes multilayer magnetic "superlattice" structures comprised of a stacked plurality of very thin magnetic/non-magnetic layer pairs, for example cobalt/platinum $(Co/Pt)_n$ and cobalt/palladium $(Co/Pd)_n$ multilayer stacks. As schematically illustrated in the cross-sectional view of FIG. 1, such multilayer stacks or superlattice structures 10 comprise n pairs of alternating discrete layers of Co (designated by the letter A in the drawing) and Pt or Pd (designated by the letter B in the drawing), where n is an integer between about 10 and about 30. Superlattice 10 is typically formed by a suitable thin film deposition technique, e.g., sputtering, and can exhibit perpendicular magnetic isotropy arising from metastable chemical modulation in the direction normal to the substrate (not shown in the figure for illustrative simplicity). Compared to conventional cobalt-chromium (Co—Cr) magnetic alloys utilized in magnetic data storage/retrieval disk applications, such $(Co/Pt)_n$ and $(Co/Pd)_n$, multilayer magnetic superlattice structures offer a number of performance advantages. For example, a $(Co/Pt)_n$ multilayer stack or superlattice 10 suitable for use as a magnetic recording layer of a perpendicular MR medium can comprise n Co/Pt or Co/Pd layer pairs, where n=about 10 to about 30, e.g., 13, and wherein each Co/Pt layer pair consists of an about 3 Å thick Co layer adjacent to an about 8 Å thick Pt or Pd layer; for a total of 26 separate (or discrete) layers. Such multilayer magnetic superlattice structures are characterized by having a large perpendicular anisotropy, high coercivity $H_c$, and a high squareness ratio of a magnetic hysteresis (M—H) loop measured in the perpendicular direction. By way of illustration, $(Co/Pt)_n$ and $(Co/Pd)_n$ multilayer magnetic superlattices, wherein n=about 10 to about 30 Co/Pt or Co/Pd layer pairs having thicknesses as indicated supra and fabricated, e.g., by means of techniques disclosed in U.S. Pat. No. 5,750,270, the entire disclosure of which is incorporated herein by reference, exhibit perpendicular anisotropies exceeding about 2×10$^6$ erg/cm$^3$; coercivities as high as about 5,000 Oe; squareness ratios (S) of a M—H loop, measured in the perpendicular direction, of from about 0.85 to about 1.0, and carrier-to-noise ratios ("CNR") of from about 30 dB to about 60 dB.

A key advance in magnetic recording (MR) technology which has brought about very significant increases in the data storage densities of magnetic disks has been the development of extremely sensitive magnetic read/write devices which utilize separate magnetoresistive read heads and inductive write heads. The magnetoresistive effect, wherein a change in electrical resistance is exhibited in the presence of a magnetic field, has long been known; however, utilization of the effect in practical MR devices was limited by the very small magnetoresistive response of the available materials. The development in recent years of materials and techniques (e.g., sputtering) for producing materials which exhibit much larger magnetoresistive responses, such as Fe—Cr multilayer thin films, has resulted in the formation of practical read heads based upon what is termed the giant magnetoresistive effect, or "GMR". Further developments in GMR-based technology have resulted in the formation of GMR-based head structures, known as GMR "spin valve" heads, which advantageously do not require a strong external magnetic to produce large resistance changes, and can detect weak signals from tiny magnetic bits.

The use of such GMR-based spin valve heads can significantly increase the areal density of MR media and systems by increasing the track density, as expressed by the number of tracks per inch ("TPI") and the linear density, as expressed by the number of bits per inch ("BPI"), where areal density=TPI×BPI. Currently, GMR-based spin valve heads are utilized for obtaining areal recording densities of more than about 10 Gb/in$^2$; however, even greater recording densities are desired. A difficulty encountered with further increase in the BPI of conventional MR media is that the smaller grain sizes necessary for increase in the BPI results in thermal instability of the media due to exceeding the superparamagnetic limit.

As indicated supra, multilayer magnetic superlattice structures can provide several advantages vis-à-vis conventional thin-film MR media, when utilized in fabricating very high areal density MR media. Specifically, multilayer magnetic superlattice MR media exhibit higher interfacial (i.e., perpendicular) anisotropy (Ku or $K_\perp$) than conventional thin film MR media, such that the value of KuV/kT is greater (where Ku=anisotropy constant; V=volume in cm$^3$; k=Boltzmann's constant; and T=absolute temperature, °K); increased thermal stability; and very high values of perpendicular coercivity $H_c$, i.e., >10$^3$ Oe. In this regard, the very high values of $H_c$ attainable with multilayer magnetic superlattice structures translates into a significant increase in BPI, and thus a substantial increase in areal recording density.

Multilayer magnetic superlattice structures utilized in MR media can have either an ordered structure forming a true superlattice, or a disordered structure, variously termed a "non-superlattice multilayer" or a "pseudo-superlattice structure". In (Co/Pt)$_n$ and (Co/Pd)$_n$ multilayer superlattice structures having utility in high areal density MR media, the interfaces between the Co and Pt (or Pd) layers incur surface interactions, such as for example, spin-orbit coupling. Because Co and Pt (or Pd) have different electronic shell structures or configurations, spin-orbit coupling occurs between the spin and orbital motions of the electrons. When an external magnetic field is applied for reorienting the spin of an orbiting electron, the orbit is also reoriented. However, because the orbit is strongly coupled to the metal lattice, the spin axis of the electron resists rotation. The energy required for reorienting (i.e., rotating) the spin system of a magnetic domain away from the easy direction is termed the anisotropy energy. The stronger the spin-orbit coupling, or interaction, the higher the anisotropy energy and the coercivity $H_c$.

It is believed that an increase in the interfacial anisotropy of (Co/Pt)$_n$, and (CO/Pd)$_n$, multilayer magnetic superlattice structures, as by an increase in the disorder or "broken symmetry" at each of the Co/Pt or Co/Pd interfaces, can result in the obtainment of very high perpendicular magnetic coercivities $H_c$ necessary for fabricating ultra-high areal density, thermally stable MR media, i.e., perpendicular coercivities on the order of about 10$^4$ Oe. It is further believed that the amount or degree of disorder or "broken symmetry" at each of the Co/Pt or Co/Pd interfaces of sputtered (Co/Pt)$_n$ and (Co/Pd)$_n$ superlattices can be increased by substituting the conventionally employed Ar sputtering gas with a higher atomic weight sputtering gas, e.g., Kr or Xe, thereby providing bombardment of the deposited films with ionized particles having greater momentum, resulting in a greater amount of lattice disruption, disorder, and/or "broken symmetry" at the layer interfaces. One such sputtering process utilizing Kr and/or Xe for forming a (Pt/Co)$_n$ multilayer film, for use in magneto-optical ("MO") recording medium, is disclosed in U.S. Pat. No. 5,106,703 to Carcia, the entire disclosure of which is incorporated herein by reference. However, the sputtering process disclosed therein utilized a relatively low sputtering power density and a relatively large target-to-substrate spacing, and the highest value of the perpendicular magnetic coercivity of the films obtained in any of the illustrative Examples was less than about 1,500 Oe, with the majority of (Co/Pt)$_n$ multilayer magnetic films exhibiting coercivities below about 10$^3$ Oe. Such values of $H_c$ are considered too low for obtaining MR media with ultra-high areal recording/storage densities on the order of Gbit/in$^2$.

Accordingly, there exists a need for improved methodology for forming, by sputtering, (Co/Pt)$_n$ and (Co/Pd)$_n$ multi layer magnetic superlattice structures exhibiting very high perpendicular magnetic coercivities $H_c$, i.e., as high as about 10,000 Oe, which improved methodology can be easily and readily implemented in a cost-effective manner for fabrication of ultra-high areal recording density MR media. Further, there exists a need for improved perpendicular MR media having ultra-high areal recording densities of from about 100 Gbit/in$^2$ to about 600 Gbit/in$^2$ and improved thermal stability, which media can be fabricated in an economical fashion utilizing conventional manufacturing equipment.

The present invention, wherein (Co/Pt)$_n$ and (Co/Pd)$_n$ multilayer magnetic superlattice structures having very large values of perpendicular coercivities $H_c$ as high as about 10,000 Oe, are formed by sputtering of Co and Pt or Pd targets in an atmosphere containing at least one of Kr and Xe sputtering gases at relatively high power densities and small target-to-substrate spacings, effectively addresses and solves problems attendant upon the use of conventional sputtering techniques for obtaining high quality multilayer magnetic superlattice structures suitable for use in manufacturing improved perpendicular MR media having ultra-high areal recording densities with good thermal stability, while maintaining full compatibility with all aspects of automated MR media manufacturing technology. Further, the methodology provided by the present invention enjoys diverse utility in the manufacture of all manner of films, devices, and products requiring multilayer magnetic thin film coatings and structures exhibiting very high values of perpendicular anisotropy and magnetic coercivity.

DISCLOSURE OF THE INVENTION

An advantage of the present invention is an improved method for sputter deposition of thin-film, multilayer magnetic superlattice stacks and structures having perpendicular magnetic coercivities as high as about 10,000 Oe.

Another advantage of the present invention is a method for manufacturing improved perpendicular MR media including multilayer magnetic superlattices having perpendicular magnetic coercivities as high as about 10,000 Oe and ultra-high areal recording densities of from about 100 Gbit/in$^2$ to about 600 Gbit/in$^2$.

Yet another advantage of the present invention is improved perpendicular magnetic recording media having perpendicular coercivities as high as about 10,000 Oe and areal recording densities of from about 100 Gbit/in² to about 600 Gbit/in².

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to one aspect of the present invention, the foregoing and other advantages are obtained in part by a method of forming a magnetic thin film having a multilayer magnetic superlattice structure, the multilayer magnetic superlattice structure having a perpendicular magnetic coercivity of from about 5,000 to about 10,000 Oe and comprising a stacked plurality of magnetic/non-magnetic layer pairs, the method comprising the steps of:

(a) providing a non-magnetic substrate having a surface for deposition thereon;

(b) providing a pair of sputtering targets having respective sputtering surfaces comprised of the materials of said magnetic and non-magnetic layers, the sputtering surface of each of the targets being positioned from about 0.5 to about 1.5 inches away from the substrate surface in an atmosphere containing at least one of Kr and Xe sputtering gases at a pressure of from about 5 to about 15 mTorr; and (c) forming the stacked plurality of magnetic/non-magnetic layer pairs comprising said multilayer magnetic superlattice structure on the substrate surface by applying a sputtering power density of from about 20 to about 40 W/in² to each of the sputtering surfaces.

According to embodiments of the present invention, step (c) comprises DC magnetron sputtering of each of the pair of sputtering targets, and the substrate surface is alternately exposed to sputtered particle flux from each of the sputtering surfaces.

According to particular embodiments of the present invention, step (c) comprises forming the stacked plurality of magnetic/non-magnetic layer pairs wherein the magnetic layer of each layer pair is from about 3 to about 5 Å thick and comprises a material selected from the group consisting of Co, CoCr, and CoX, where X is B, Ru, Ta, Pt, or Pd; the non-magnetic layer of each magnetic/non-magnetic layer pair is from about 10 to about 15 Å thick and comprises a material selected from the group consisting of Pt and Pd; and the number n of magnetic/non-magnetic layer pairs is from about 10 to about 30.

According to specific embodiments of the present invention, step (c) comprises forming the stacked plurality of magnetic/non-magnetic layer pairs such that the magnetic layer of each layer pair is about 3 Å thick and comprises Co, the non-magnetic layer of each layer pair is about 10 Å thick and comprises Pd; step (b) comprises providing a sputtering atmosphere containing Kr at a pressure of about 10 mTorr and positioning the sputtering surface of each of the sputtering targets at a spacing of about 1 inch away from the substrate surface; and step (c) further comprises applying a sputtering power density of about 30 W/in² to each sputtering surface.

According to a further aspect of the present invention, a method of manufacturing a perpendicular magnetic recording medium including a multilayer magnetic superlattice structure fabricated according to the above method is provided, wherein:

step (a) comprises providing a non-magnetic substrate comprising a non-magnetic material selected from the group consisting of non-magnetic metals, non-magnetic metal alloys, Al, Al-based alloys, NiP-plated Al, glass, ceramics, polymers, and composites thereof; the substrate further comprising, in sequence from the deposition surface:

a layer of a soft magnetic material from about 2,000 to about 5,000 Å thick and comprising a material elected from the group consisting of: FeAlN, CoNiFe, CoZrNb, and NiFe; and a seed layer from about 2 to about 50 nm thick and comprising a material selected from the group consisting of: Pd, Ta, $In_2O_3$—$SnO_2$ ("ITO"), Ta/ITO, Si, and $SiN_x$.

According to particular embodiments of the present invention, step (d) comprises forming a protective overcoat layer on the multilayer superlattice structure.

According to a yet further aspect of the present invention, an improved perpendicular magnetic recording medium fabricated according to the above-described method is provided, having an areal recording density of from about 100 Gbit/in² to about 600 Gbit/in².

Yet another aspect of the present invention is an improved perpendicular magnetic recording medium, comprising:

(a) a non-magnetic substrate having a surface; and (b) a multilayer magnetic superlattice structure formed on the surface of the substrate, the multilayer magnetic superlattice structure having a perpendicular magnetic coercivity of from about 5,000 to about 10,000 Oe and an areal recording density of from about 100 Gbit/in² to about 600 Gbit/in², and comprising a stacked plurality of magnetic/non-magnetic layer pairs.

According to embodiments of the present invention, the magnetic layer of each magnetic/non-magnetic layer pair is from about 3 to about 5 Å thick and comprises a metal selected from the group consisting of Co, CoCr, and CoX, where X is B, Ru, Ta, Pt, or Pd; the non-magnetic layer of each magnetic/non-magnetic layer pair is from about 10 to about 15 Å thick and comprises a material selected from the group consisting of Pt and Pd, and the number n of magnetic/non-magnetic layer pairs is from about 10 to about 30.

According to particular embodiments of the present invention, the magnetic layer of each magnetic/non-magnetic layer pair is about 3 Å thick and comprises Co; the non-magnetic layer of each magnetic/non-magnetic layer pair is about 10 Å thick and comprises Pd; and the perpendicular magnetic coercivity of the magnetic superlattice structure is at least about 6,500 Oe.

According to specific embodiments of the present invention, the substrate further comprises, in sequence from the surface, a layer of a soft magnetic material and a seed layer, the multilayer magnetic superlattice structure being formed on the seed layer, wherein:

the non-magnetic substrate comprises a non-magnetic material selected from the group consisting of non-magnetic metals, non-magnetic alloys, Al, Al-based alloys, NiP-plated Al, glass, ceramics, polymers, and composites thereof;

the layer of soft magnetic material is from about 2,000 to about 5,000 Å thick and comprises a material selected from the group consisting of FeAlN, CoNiFe, CoZrNb, and NiFe; and the seed layer is from about 2 to about 50 nm thick and comprises a material selected from the group consisting of Pd, Ta, $In_2O_3$—$SnO_2$ ("ITO"), Ta/ITO, Si, and $SiN_x$.

According to further embodiments, the medium further comprises a protective overcoat layer on the multilayer magnetic superlattice structure; and according to particular embodiments, the protective overcoat layer comprises carbon (C).

Still another aspect of the present invention is an improved perpendicular magnetic recording medium, comprising:

a non-magnetic substrate having a surface; and magnetic layer means on the substrate surface for providing a perpendicular magnetic coercivity of from about 5,000 to about 10,000 Oe and an areal recording density of from about 100 Gbit/in$^2$ to about 600 Gbit/in$^2$.

According to embodiments of the present invention, the magnetic layer means comprises a multilayer magnetic superlattice structure comprised of a stacked plurality of magnetic/non-magnetic layer pairs; wherein:

the magnetic layer of each magnetic/non-magnetic layer pair is about 3 Å thick and comprises Co and the non-magnetic layer of each magnetic/non-magnetic layer pair is about 10 Å thick and comprises Pd; and the perpendicular magnetic coercivity of the multilayer magnetic superlattice structure is at least about 6,500 Oe.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which like reference numerals are employed throughout to designate similar features, wherein.

DESCRIPTION OF THE INVENTION

The present invention is based upon the discovery that multilayer magnetic superlattice structures, e.g., (Co/Pt)$_n$ and (Co/Pd)$_n$ having significantly greater perpendicular magnetic coercivities than heretofore obtained, e.g., on the order of about 10$^4$ Oe, and thus capable of providing ultra-high areal recording densities, can be fabricated by sputtering a pair of appropriately constituted targets in an atmosphere containing at least one of Kr and Xe sputtering gases, by utilizing relatively high sputtering power densities and relatively small target-to-substrate spacings. The inventive methodology thus affords several advantages not attainable by the above-described prior technique for forming multilayer magnetic superlattice structures by sputtering in a Kr or Xe atmosphere, including, inter alia, cost-effective formation of ultra-high areal recording density perpendicular MR media while utilizing conventional sputtering equipment.

Figure 2:
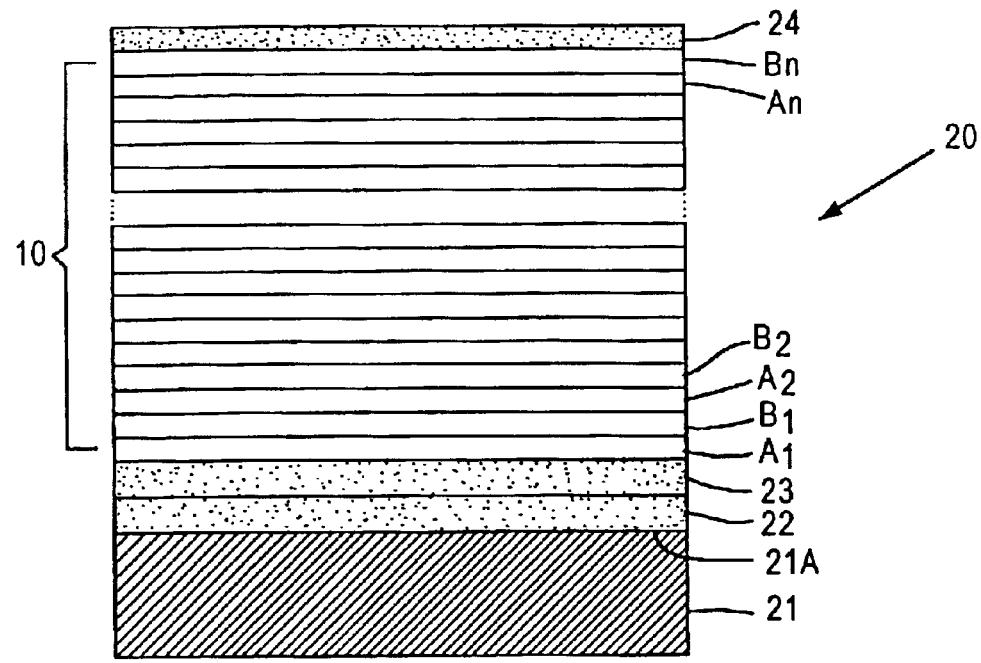
FIG. 2 schematically illustrates, in simplified, schematic cross-sectional view, a perpendicular magnetic recording (MR) medium comprising a multilayer magnetic superlattice structure according to the present invention.

Referring now to FIG. 2, shown therein in schematic cross-sectional view, is an embodiment of an ultra-high areal recording density, perpendicular MR medium 20 comprising a multilayer magnetic superlattice 10 formed according to the inventive methodology and exhibiting a very high value of perpendicular magnetic coercivity H$_c$. As illustrated, perpendicular MR medium 20 includes a non-magnetic substrate 21 comprised of a non-magnetic material selected from among non-magnetic metals and metal alloys, aluminum (Al), Al-based alloys, NiP-plated Al (NiP/Al), glass, ceramics, polymers, and composites and/or laminates of the aforementioned materials. The thickness of substrate 21 is not critical; however, in the case of MR media for use in hard disk applications, substrate 21 must be of a thickness sufficient to provide a necessary rigidity. Substrate 21 includes a suitably polished or otherwise smoothened upper surface 21A, on which a layer stack constituting the MR medium is formed.

Figure 1:
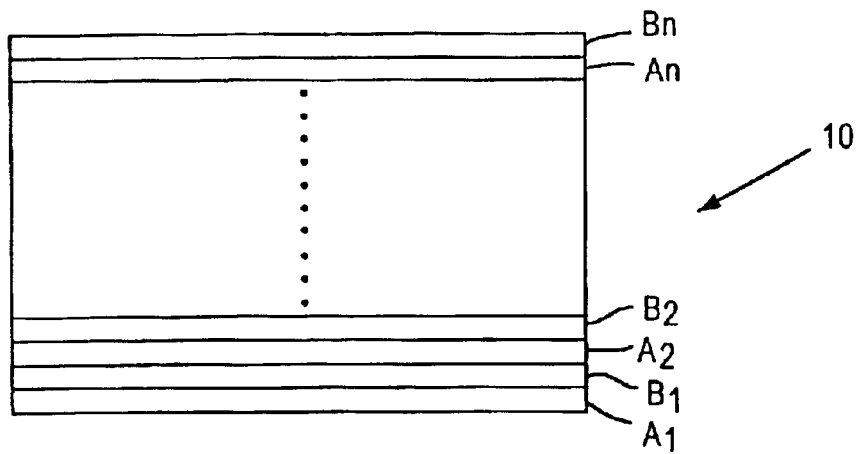
FIG. 1 schematically illustrates, in simplified, schematic cross sectional view, a (Co/Pt)$_n$ or (Co/Pd)$_n$ multilayer magnetic superlattice structure according to the present invention.

The layer stack comprises, in sequence from substrate upper surface 21A, (a) a layer 22 of a soft magnetic material from about 2,000 to about 5,000 Å thick, comprising a material selected from among FeAlN, CoNiFe, CoZrNb, and NiFe, with FeAlN being preferred in view of its very high saturation magnetic moment; (b) a seed layer 23 from about 2 to about 50 nm thick, with a thickness of about 5 nm being preferred, of a material selected from among Pd, Ta, In$_2$O$_3$—SnO$_2$ ("ITO"), Ta/ITO, Si, and SiN$_x$; (c) a multilayer magnetic superlattice structure 10 similar to that shown in FIG. 1 and comprising a vertically stacked plurality of n magnetic/non-magnetic layer preferably about 10, each magnetic layer A of each layer pair is from about 3 to about 5 Å thick, preferably about 3 Å thick, and comprises a magnetic material selected from among Co, CoCr, and CoX, where X is selected from among B (boron), Ru, Ta, Pt, and Pd, and each non-magnetic layer B of each layer pair is from about 10 to about 15 Å thick, preferably about 10 Å thick, and comprises a non-magnetic material, e.g., a metal, selected from among Pt and Pd; and (d) a protective overcoat 24, typically comprising a layer of an abrasion resistant, diamond-like carbon ("DLC") from about 10 to about 75 Å thick, preferably about 50 Å thick. In addition to the aforementioned, the layer stack may further include a lubricant topcoat layer (not shown) over the protective overcoat layer 24, comprising a layer of a fluoropolyether or perfluoropolyether polymer material, e.g., perfluoropolyethylene ("PFPE") having a thickness of from about 10 to about 35 Å, preferably about 20–25 Å thick.

Conventional techniques, such as sputtering, CVD, and/or PVD may be employed for depositing each of the soft magnetic and seed layers 22, 23, as well as the protective overcoat layer 24, with sputtering generally being preferred. The lubricant topcoat layer can be deposited by any of a variety of conventional techniques, such as dipping spraying, etc.

According to the invention, improved multilayer magnetic superlattice structures 10 exhibiting very high perpendicular magnetic coercivities, i.e., as high as about $10^4$ Oe, are formed by sputtering a pair of targets (respectively comprised of the magnetic and non-magnetic materials of the magnetic/non-magnetic layer pairs) in an atmosphere containing at least one of Kr and Xe as sputtering gases at a pressure of from about 5 to about 15 mTorr, with about 10 mTorr being preferred; at a relatively high sputtering power density of from about 20 to about 40 W/in$^2$, with about 30 W/in$^2$ being preferred; and with a relatively close target-to-substrate spacing of from about 0.5 to about 1.5 inches, with about 1 inch being preferred. Either DC or RF magnetron sputtering may be utilized, and the substrate alternately exposed to sputtered particle flux from each of the pair of targets by effecting relative motion therebetween, as by moving the targets relative to the substrate or moving the substrate relative to the targets. The substrate temperature need not be controlled during sputtering, and may rise from about room temperature (25° C.) to about 75° C. during the course of sputtering as a result of ion bombardment leading to energy transfer.

Figure 3:
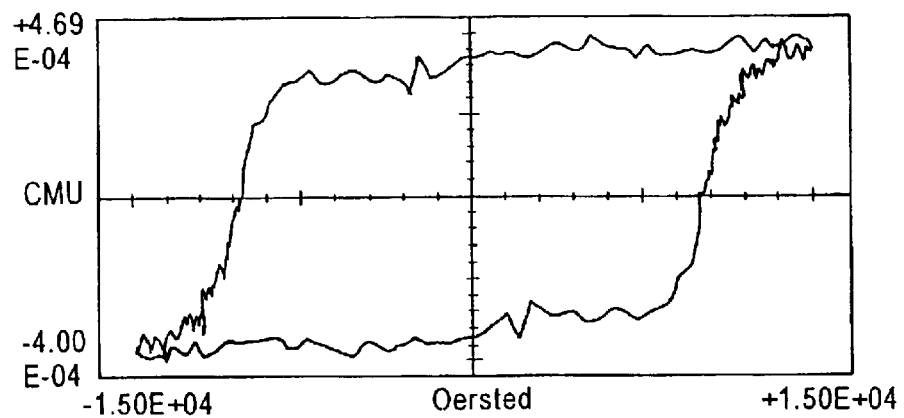
FIG. 3 is a graph for illustrating an example of the very high perpendicular coercivities obtainable according to the inventive methodology.

Adverting to FIG. 3, which is a graph showing the variation of the magnetization with applied magnetic field, of a multilayer magnetic superlattice 10 composed of about 10 to about 30 Co/Pt or Co/Pd layer pairs formed according to the inventive methodology, it is evident that very high perpendicular magnetic coercivities $H_c$ of about 5,000 to about 10,000 Oe, e.g., at least about 6,500 Oe, are obtained. Magnetic superlattices having such high perpendicular coercivities are, in turn, utilized as part of improved perpendicular MR media having ultra-high areal recording densities of from about 100 Gbit/in$^2$ to about 600 Gbit/in$^2$ when used with GMR spin valve-type heads.

While the exact mechanism or reason for the obtainment of multilayer magnetic superlattices having such high perpendicular magnetic coercivities (and thus ultra-high recording densities when incorporated into MR media) is not known with certainty, and not wishing to be bound by any particular theory, it is nonetheless believed that the advantageous result provided by the present invention arises from a greater amount of lattice disorder or "broken symmetry" produced at the interfaces between the alternating Co (i.e., magnetic) and Pt or Pd (non-magnetic) layers, resulting from the use of higher sputtering power and closer target-to-substrate spacing vis-à-vis the conventional art described above. As a consequence of the use of higher sputtering power and closer target-to-substrate spacing, a greater flux of higher energy Kr and/or Xe ions is available for bombardment of the growing films, whereby a multilayer superlattice structure is formed with a greater degree of interfacial anisotropy, leading to very high perpendicular magnetic coercivities.

EXAMPLE

Figure 4:
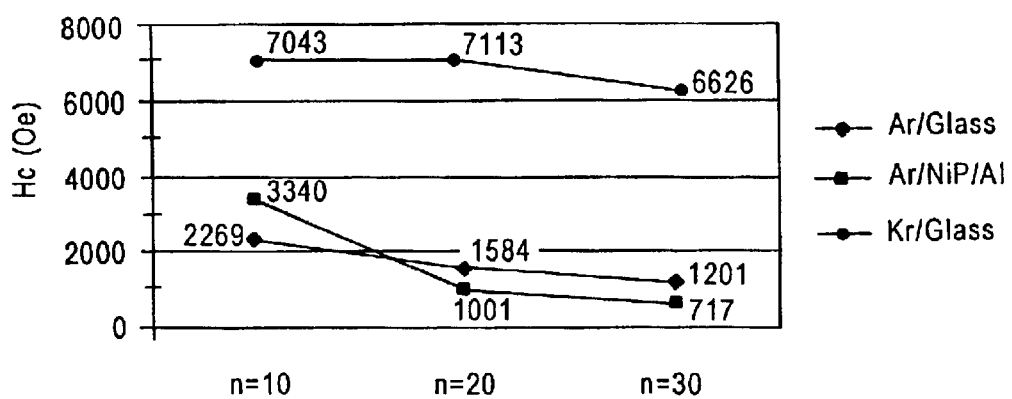
FIG. 4 is a graph for illustrating the effect of Kr vs. Ar as sputtering gas on perpendicular coercivity of (Co/Pd)$_n$ multilayer magnetic superlattice structures.

Using Kr (atomic weight 84) as a sputtering gas atmosphere at a pressure of about 10 mTorr and 2 inch diameter Co and Pd magnetron sputtering targets operated at a DC sputtering power of about 100 W (=sputtering power density of about 32 W/in$^2$) at a target-to-substrate spacing of about 1 inch, a series of (Co/Pd)$_n$ multilayer magnetic superlattice structures, with n=10, 20, or 30 were formed on glass substrates, with respective Co and Pd layer thicknesses of about 3 Å and 10 Å. A similar series of (CO/Pd)$_n$ multilayer magnetic superlattice structures was formed on glass and NiP-plated Al substrates for comparison purposes, utilizing the same conditions as described above, but with substitution of Ar (atomic weight 40) as the sputtering gas atmosphere for the Kr. The results obtained are given below in tabular form and shown in graphical form in FIG. 4, wherein the substantial invention vis-à-vis conventional sputtering in an Ar atmosphere or sputtering in Kr and/or Xe atmospheres according to the conventional art.

| | Perpendicular Coercivity, Oe | | | | | |
|---|---|---|---|---|---|---|
| | Kr Atmosphere | | | Ar Atmosphere | | |
| Substrate | n = 10 | n = 20 | n = 30 | n = 10 | n = 20 | n = 30 |
| Glass | 7043 | 7113 | 6626 | 2269 | 1584 | 1201 |
| NiP/Al | | | | 3340 | 1001 | 717 |

Thus, the present invention advantageously provides, as by use of conventional sputtering equipment, improved high quality, thermally stable, multilayer magnetic superlattice structures having substantially increased perpendicular magnetic coercivities vis-à-vis those obtainable according to conventional sputtering practices utilizing either Kr and/or Xe, or Ar as sputtering gas, and thus facilitates fabrication of ultra-high areal recording density perpendicular MR media utilizing such improved multilayer magnetic superlattice structures as the active recording layer. Moreover, the inventive methodology can be practiced in a cost-effective manner utilizing conventional manufacturing technology and equipment for automated, large-scale manufacture of MR media, such as hard disks. Finally, the inventive methodology is not limited to use with hard disk substrates but rather is broadly applicable to the formation of high magnetic coercivity multilayer superlattice structures for use in all manner of devices and products.

In the previous description, numerous specific details are set forth, such as specific materials, structures, processes, etc., in order to provide a better understanding of the present invention. However, the present invention can be practiced without resorting to the details specifically set forth herein. In other instances, well-known processing techniques and structures have not been described in detail in order not to unnecessarily obscure the present invention.

Only the preferred embodiments of the present invention and but a few examples of its versatility are shown and described in the present disclosure. It is to be understood that the present invention is capable of use in various other combinations and environments and is susceptible of changes and/or modifications within the scope of the inventive concept as expressed herein.

What is claimed is:

1. A method of forming a magnetic thin film having a multilayer magnetic superlattice structure, said multilayer magnetic superlattice structure having a perpendicular magnetic coercivity of from about 5,000 to about 10,000 Oe and comprising a stacked plurality of magnetic/non-magnetic layer pairs, said method comprising the steps of:

(a) providing a non-magnetic substrate having a surface for deposition thereon; and (b) providing a pair of sputtering targets having respective sputtering surfaces comprised of the materials of said magnetic and non-magnetic layers, said sputtering surface of each of said targets being positioned from about 0.5 to about 1.5 inches away from said substrate surface in an atmosphere containing at least one of Kr and Xe sputtering gases at a pressure of from about 5 to about 15 mTorr; and (c) forming said stacked plurality of magnetic/non-magnetic layer pairs comprising said multilayer magnetic superlattice structure on said substrate surface by applying a sputtering power density of from about 20 to about 40 W/in$^2$ to each of said sputtering surfaces.

2. The method according to claim 1, wherein:

step (c) comprises DC magnetron sputtering of each of said pair of sputtering targets and said substrate surface is alternately exposed to sputtered particle flux from each of said sputtering surfaces.

3. The method according to claim 1, wherein:

step (c) comprises forming said stacked plurality of magnetic/non-magnetic layer pairs wherein the magnetic layer of each layer pair is from about 3 to about 5 Å thick and comprises a material selected from the group consisting of Co, CoCr, and CoX, where X is B, Ru, Ta, Pt, or Pd; the non-magnetic layer of each magnetic/non-magnetic layer pair is from about 10 to about 15 Å thick and comprises a material selected from the group consisting of Pt and Pd; and the number n of magnetic/non-magnetic layer pairs is from about 10 to about 30.

4. The method according to claim 3, wherein:

step (c) comprises forming said stacked plurality of magnetic/non-magnetic layer pairs such that the magnetic layer of each said layer pair is about 3 Å thick and comprises Co, and the non-magnetic layer of each said layer pair is about 10 Å thick and comprises Pd.

5. The method according to claim 4, wherein:

step (b) comprises providing a sputtering atmosphere containing Kr at a pressure of about 10 mTorr and positioning said sputtering surface of each of said sputtering targets at a spacing of about 1 inch away from said substrate surface; and step (c) comprises applying a sputtering power density of about 30 W/in$^2$ to each said sputtering surface.

6. A method of manufacturing a perpendicular magnetic recording medium including a multilayer magnetic superlattice structure fabricated according to claim 1, wherein:

step (a) comprises providing a non-magnetic substrate comprising a non-magnetic material selected from the group consisting of Al, Al-based alloys, NiP-plated Al, other non-magnetic metals, other non-magnetic metal alloys, glass, ceramics, polymers, and composites thereof; said substrate further comprising, in sequence from said deposition surface:

a layer of a soft magnetic material from about 2,000 to about 5,000 Å thick and comprising a material selected from the group consisting of: FeAlN, CoNiFe, CoZrNb, and NiFe; and a seed layer from about 2 to about 50 nm thick and comprising a material selected from the group consisting of: Pd, Ta, In$_2$O$_3$SnO$_2$ ("ITO"), Ta/ITO, Si, and SiN$_x$.

7. The method according to claim 6, comprising the further step of:

(d) forming a protective overcoat layer on said multilayer magnetic superlattice structure.

8. A method of manufacturing a perpendicular magnetic recording medium, comprising:

sputter depositing a multilayer structure of alternating magnetic and non-magnetic layers, using a deposition power density of about 20 W/in$^2$ to about 40 W/in$^2$ per target, in an environment comprising at least one of xenon and krypton.

9. The method of claim 8 wherein said environment further comprises a pressure of about 5 mTorr to about 15 mTorr.

10. The method of claim 8 further including varying the target to substrate from about 0.5 inches to about 1.5 inches.

11. The method of claim 8 further including moving a substrate and a target relative to each other.

* * * * *